US007810913B2

(12) United States Patent
Furukawa

(10) Patent No.: US 7,810,913 B2
(45) Date of Patent: Oct. 12, 2010

(54) INKJET RECORDING SYSTEM AND RECORDING APPARATUS

(75) Inventor: Noriaki Furukawa, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 518 days.

(21) Appl. No.: 11/979,071

(22) Filed: Oct. 30, 2007

(65) Prior Publication Data

US 2008/0100675 A1 May 1, 2008

(30) Foreign Application Priority Data

Oct. 31, 2006 (JP) ............................ 2006-296545
Oct. 31, 2006 (JP) ............................ 2006-296546

(51) Int. Cl.

| | |
|---|---|
| ***B41J 2/45*** | (2006.01) |
| ***B41J 29/38*** | (2006.01) |
| ***B41J 2/135*** | (2006.01) |
| ***B41J 2/04*** | (2006.01) |
| ***B41J 2/05*** | (2006.01) |
| ***G01D 11/00*** | (2006.01) |
| ***H01L 41/00*** | (2006.01) |

(52) U.S. Cl. .............................. 347/68; 347/9; 347/14; 347/46; 347/54; 347/56; 347/62; 347/63; 347/64; 347/65; 347/69; 347/70; 347/71; 347/72; 347/100; 310/328

(58) Field of Classification Search .................... 347/9, 347/14, 46, 54, 56, 62–65, 68–72, 100; 310/328
See application file for complete search history.

(56) References Cited

U.S. PATENT DOCUMENTS 5,854,307 A * 12/1998 Kimura et al. .............. 523/161

FOREIGN PATENT DOCUMENTS

JP 3454514 7/2003
JP 2004-114308 4/2004

* cited by examiner

*Primary Examiner*—Charlie Peng
*Assistant Examiner*—Hung Lam
(74) *Attorney, Agent, or Firm*—Clark & Brody

(57) ABSTRACT

An inkjet recording system includes an inkjet recording head in which a part of wall face of a pressure chamber in which a nozzle is provided is formed of a piezoelectric element. Centerline average roughness Ra of the piezoelectric element is 0.05 to 2 μm, viscosity of the ink is 2.0 to 10.0 mPa·s, and the following expression (1) is satisfied;

$$\sqrt{\frac{r\gamma\cos\theta}{2\eta}} \geq 0.07 \quad (1)$$

wherein r represents centerline average roughness (μm) of surface of piezoelectric element forming wall face of the pressure chamber, γ represents surface tension (mN/m) of ink, η represents viscosity of ink (mPa·s), and θ represents contact angle (degree) of ink with respect to piezoelectric element.

14 Claims, 3 Drawing Sheets

INKJET RECORDING SYSTEM AND RECORDING APPARATUS

BACKGROUND OF THE INVENTION

1. Field of the Invention

The present invention relates to inkjet recording systems and recording apparatuses having excellent initial ink chargeability.

2. Description of Related Art

Recent outstanding improvement in inkjet recording technique has enabled production of high-definition images which are very similar to photographs. Consequently, inkjet recording has been widely used in various fields of art. In association with this, there is a need of improving printing speed as well as obtaining high-definition images. As a measure for improving printing speed, there is known a method of increasing the number of nozzles, and discharging ink droplet in larger amount per unit time from each head. In such a measure, driving frequency of 15 kHz or higher is desired, and it is necessary to supply ink that is to be used in unit time by every head without any excess and deficiency from an ink cartridge.

However, in the initial of ink to the inkjet head, the pressure to each nozzle is not equally distributed since there are a great number of nozzles, whereby bubbles remain in the ink flow channel and discharge defect and continuous discharging property are affected. Such bubbles strongly attach to the inner wall surface of the channel, and cannot be easily discharged.

In order to overcome such a problem, a method of imparting hydrophilicity by acid treatment or plasma treatment, or of containing a filler imparted with hydrophilicity by acid treatment has been proposed (e.g., Japanese Patent No. 3454514 publication) to improve the wettability of a head constituting member made of a resin material. In terms of increasing the toughness and strength of the piezoelectric element, a method of forming each layer by burning in a laminate-type piezoelectric element so as to increase the toughness has been proposed (see e.g., Japanese Patent Application Laid-Open Publication No. 2004-114308).

However, in the structure disclosed in the Japanese Patent No. 3454514 publication in which ink directly contacts piezoelectric elements, piezoelectric elements may get corroded or deteriorated by hydrophilizing treatment. Moreover, since the piezoelectric element disclosed in the Japanese Patent Application Laid-Open Publication No. 2004-114308 is a burnt member of ceramics or the like, its surface has fine bumpy structure, so that ink is difficult to be charged. When bubbles remain on the surface of the piezoelectric element that generates pressure due to failure in charging of ink, the generated pressure will not travel satisfactorily, so that discharge defects such as lowering in continuous discharging property, decrease in discharging speed, or discharge failure will occur.

SUMMARY OF THE INVENTION

It is an object of the present invention to provide an inkjet recording system in which discharge defect in time of continuous discharge that occurs in the initial charging of ink to the inkjet recording head is improved, and a recording apparatus using the same.

Inventors of the present invention made diligent efforts for achieving the above objects, and as a result, formed the new fact that defect in continuous discharging property that occurs in the initial charging of ink is improved if average surface roughness Ra of piezoelectric element and viscosity of the ink fall within a predetermined range, and a value calculated from a relational expression between surface roughness of the piezoelectric element and physical property value of the ink is larger than or equal to a predetermined value.

That is, in an inkjet recording system of the present invention, a part of wall face of a pressure chamber in which a nozzle is provided is formed of a piezoelectric element, and the piezoelectric element is activated and deformed to make pressure wave act on ink in the pressure chamber, thereby discharging an ink droplet from the nozzle. In particular, surface roughness Ra of the piezoelectric element ranges from 0.05 to 2 μm, viscosity of the ink ranges from 2.0 to 10.0 mPa·s, and the following expression (1) is satisfied;

$$\sqrt{\frac{r\gamma\cos\theta}{2\eta}} \geq 0.07 \tag{1}$$

wherein r represents centerline average roughness (μm) of surface of piezoelectric element forming wall face of the pressure chamber, γ represents surface tension (mN/m) of ink, η represents viscosity of ink (mPa·s), and θ represents contact angle (degree) of ink with respect to piezoelectric element.

Furthermore, the inventors newly found that failure in continuous discharging property that occurs in initial charging of ink is improved if average inclination of the surface of piezoelectric element and the viscosity of ink fall within a predetermined range, and a relational expression of the average inclination of the piezoelectric element and the physical property value of the ink is greater than or equal to a predetermined value.

In other words, another inkjet recording system of the present invention is an inkjet recording system including an inkjet recording head in which a part of wall face of a pressure chamber in which a nozzle is provided is formed of a piezoelectric element, and the piezoelectric element is activated and deformed to make pressure wave act on ink in the pressure chamber, thereby discharging an ink droplet from the nozzle, wherein an average inclination ha ranges from 100 to 1000 mrad, viscosity of the ink ranges from 2.0 to 10.0 mPa·s, and the following expression (2) is satisfied;

$$\frac{\cos\theta}{\eta} \times \cos(\Delta a) \geq 0.040 \tag{2}$$

wherein Δa represents average inclination (rad) of surface of piezoelectric element forming wall face of pressure chamber, θ represents contact angle (degree) of ink with respect to piezoelectric element, and η represents viscosity of ink (mPa·s).

According to the present invention, when the average surface roughness of the piezoelectric element and the viscosity of the ink fall within a predetermined range and the relational expression (1) of the surface roughness of the piezoelectric element and the physical property value of the ink is greater than or equal to a predetermined value, or when the average inclination of the surface of piezoelectric element and the viscosity of the ink fall within a predetermined range and the relational expression (2) of the average inclination of the piezoelectric element and the physical property value of the ink is greater than or equal to a predetermined value, failure in continuous discharging property that occurs in initial charging of ink is improved, and an inkjet recording system excelling in reduction of image unevenness is obtained.

DETAILED DESCRIPTION OF THE PREFERRED EMBODIMENTS

First Embodiment

Figure 1:
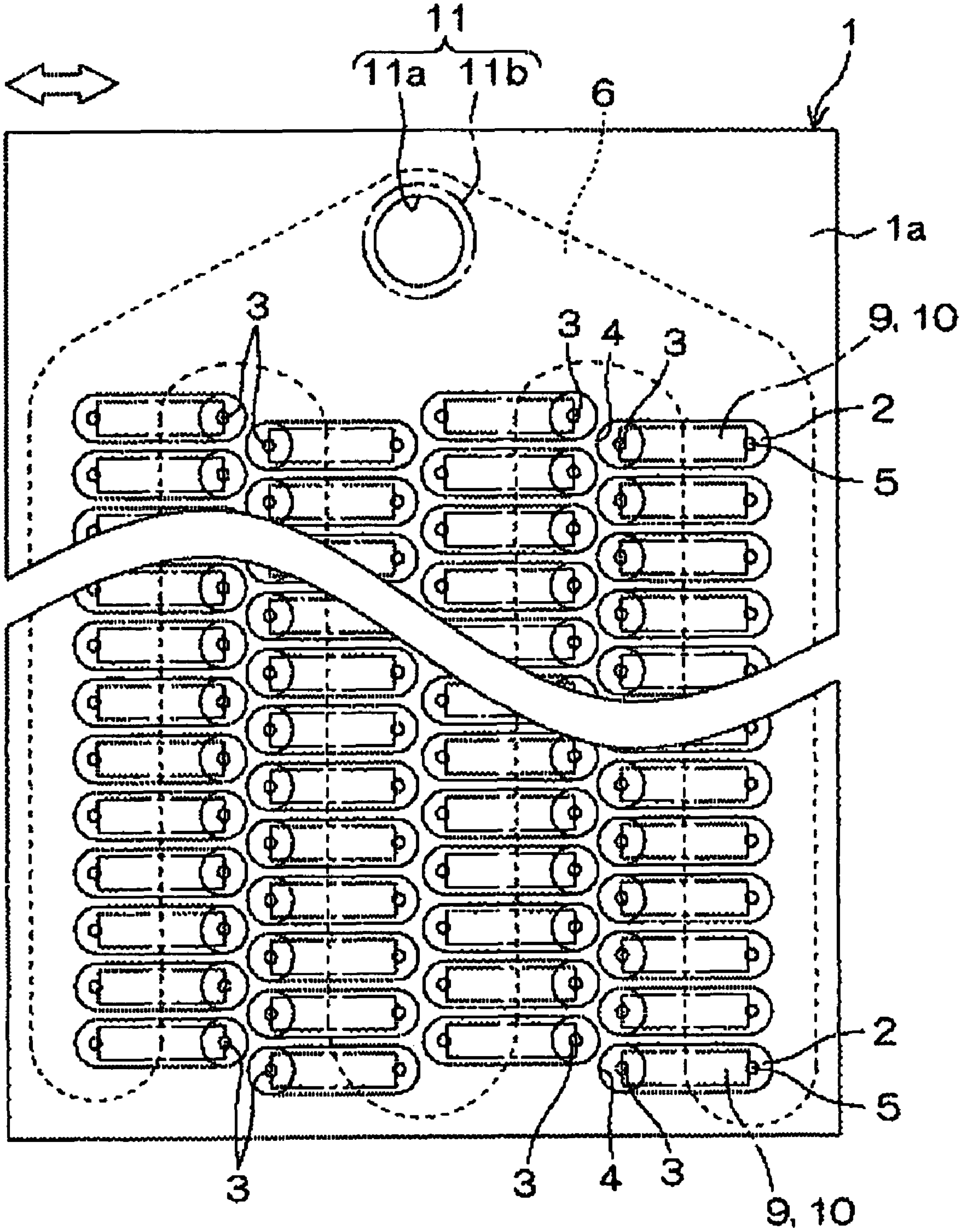
FIG. 1 is a plan view showing one embodiment of an inkjet recording head according to the present invention.

In the following, one embodiment of an inkjet recording system according to the present invention will be explained in detail based on the drawings.

As shown in FIG. 2, in the inkjet recording head of the present invention, ink is charged to a pressure chamber 2 from a supply port 5. The pressure chambers 2 of the same number as the number of nozzles are provided. The number of nozzles is 500 or more, and preferably, 1000 to 3000 to achieve high-speed printing. Thus, a pressure of greater than or equal to 50 kPa is required to supply ink to all the pressure chambers 2 without any excess. The pressure of lower than or equal to 1000 kPa is preferable since the adhesive might come off if the pressure by a pump is too high when such an inkjet recording head is formed by laminating a plurality of substrates 1$a$ to 1$d$ with adhesive.

The pressure is transmitted from a piezoelectric element 8 to the ink in the above recording head, but driving voltage of only up to about 40V can be applied as cracks may form in the piezoelectric element 8 if the driving voltage is set too high. If the distance between the recording head and a recording medium is 1.5 mm, which is normally used, the viscosity of ink has an upper limitation in obtaining the discharging speed of 10 m/s, which is the desired ink discharging speed.

According to the present invention, the viscosity of ink ranges from 2 to 10 mPa·s, and preferably ranges from 3 to 9 mPa·s. If the viscosity of ink exceeds 10 mPa·s, the supply of ink to the pressure chamber 2 becomes insufficient, and continuous discharge cannot be carried out. If the viscosity of ink is less than 2 mPa·s, microscopic vibration remains in the channel from the pressure chamber 2 to the nozzle 3 thereby adversely affecting the continuous discharge.

As described above, since the supply port for charging ink to the pressure chamber 2 is a very narrow capillary tube ranging from 20 to 60 μm, air lock occurs in time of initial charging at the relevant portion if the surface tension of ink is higher than 45 mN/m, and ink may not be charged.

If the ink is supplied at a pressure of greater than or equal to 50 kPa in the initial charging, surface roughness of the piezoelectric element 8 must be considered to charge the ink without forming bubbles in the ink channel.

According to the present invention, the centerline average roughness Ra of the surface of the piezoelectric element 8 ranges from 0.05 to 2 μm, and preferably 0.05 to 0.14 μm. If the surface roughness is within the range, generation of bubbles in the ink channel is suppressed. If the surface roughness becomes greater than 2 μm, cracks easily form in the piezoelectric element 8 and the driving voltage that can be applied lowers, whereby the ink discharging speed of 10 m/s cannot be obtained.

Furthermore, according to the present invention, when the relationship between the surface roughness of the piezoelectric element 8 and the physical property value of the ink has the terms excluding the time term from equation (3), that is, the left side of equation (1) to greater than or equal to 0.07 based on the expression of Lucas-Washburn related to penetration of fluid expressed in equation (3) below, initial chargeability is satisfied and continuous discharging property and discharge failure are improved, and furthermore, an effect excelling in image unevenness can be obtained;

$$Z(t) = \sqrt{\frac{r\gamma\cos\theta}{2\eta}} \cdot \sqrt{t} \tag{3}$$

where Z(t) is the penetration (flow) distance, r is the surface roughness of the piezoelectric element, γ is the surface tension of ink, η is viscosity of ink, θ is constant angle (degree) of ink with respect to piezoelectric element, and t is time.

(Ink)

The ink in the present invention consists at least of water, a coloring agent, a surfactant, and a water-soluble organic solvent and may be added with a pH modifier, an antiseptic and antifungal agent and so on as is necessary.

As a coloring agent, any of dyes such as direct dyes, acidic dyes and basic dyes, and pigments may be used. In the present invention, pigments are preferably used from the view points of high optical concentration, water resistance and light resistance.

Examples of component of pigment include coloring pigment components including organic pigments such as insoluble azo pigment, soluble azo pigment, phthalocyanine blue, isoindolinone, quinacridone, dioxadine violet, berinone, betarine and the like, and inorganic pigments such as carbon black, titanium dioxide and so like; and extender pigments such as white clay, talc, clay, diatomaceous earth, calcium carbonate, barium sulfate, titanium oxide, alumina white, silica, kaolin, aluminum hydroxide and the like.

Concrete examples of organic pigment will be recited below. For instance, as magenta pigments, C.I. pigment red 2, C.I. pigment red 3, C.I. pigment red 5, C.I. pigment red 6, C.I. pigment red 7, C.I. pigment red 15, C.I. pigment red 16, C.I. pigment red 48:1, C.I. pigment red 53:1, C.I. pigment red 57:1, C.I. pigment red 122, C.I. pigment red 123, C.I. pigment red 139, C.I. pigment red 144, C.I. pigment red 149, C.I. pigment red 166, C.I. pigment red 166, C.I. pigment red 177, C.I. pigment red 178, and C.I. pigment red 222 can be recited.

In an inkjet recording method, recently, color images are formed, for example, using six colors including orange and green in addition to the base colors, yellow, magenta, cyan and black, or using eight colors including light magenta and light blue in addition to the above six colors.

To obtain these color phases, those having excellent weather resistance are preferred, and particularly preferred are C.I. pigment yellow 138, 154, 180, 185 for yellow, C.I. pigment red 122, 202, C.I. pigment violet 19 for magenta, C.I. pigment blue 15 for cyan, C.I. solvent black 3, and particularly acidic or neutral pigments of C.I. pigment black 7 for black, C.I. pigment orange 43, 64, 71 for orange, and C.I. pigment green 7, 36 for green.

The content of pigment in the total liquid medium is preferably 1 to 10% by mass, and more preferably 3 to 7% by mass.

For dispersing pigment in ink solvent, water-soluble resin may be used, preferably, water-soluble resin such as styrene-acryl-acrylate alkyl ester copolymer, styrene-acrylate copolymer, styrene-maleate copolymer, styrene-maleate-acrylate alkyl ester copolymer, styrene-methacrylate copolymer, styrene-methacrylate alkyl ester copolymer, styrene-maleate half ester copolymer, vinylnaphthalene-acrylate copolymer, vinylnaphthalene-maleate copolymer and so on.

The content of water-soluble resin in the total liquid medium is preferably 0.1 to 10% by wt, and more preferably 1 to 5% by wt. These water-soluble resins may be used in combination of two or more kinds.

For dispersing the pigment, a ball mill, sand mill, roll mill, agitator, sonic homogenizer, wet jet mill, paint shaker or the like may be used.

The pigment is preferably subjected to centrifugation by a centrifuge or filtration by a filter so as to remove contaminants, dusts, coarse particles occurring in the process of dispersion.

An average particle diameter of pigment particles according to the present invention is preferably 30 to 300 nm, and more preferably 50 to 150 nm. Average particle diameter may be measured by using a dynamic light scattering particle size meter (LB-550 available from HORIBA, Ltd.).

As a surfactant used in ink, preferably used are polyoxyethylene alkyl ethers, polyoxyethylene alkyl allyl ethers, acetylene glycols, polyoxyethylene-polyoxypropylene block copolymers and the like nonionic surfactants.

The ink obtains the desired surface tension by adjusting the adding amount of the surfactant.

Examples of the water-soluble organic solvents include ethyleneglycol monobutyl ether, triethyleneglycol monomethyl ether, diethyleneglycol monomethyl ether, ethylene glycol monomethylether, triethyleneglycol, hexyleneglycol, octanediol, thiodiglycol, 2-butyl-2-ethyl-1,3-propanediol, 3-methyl-1,5-pentanediol, 2-ethyl-2-methyl-1,3-propanediol, 2,4-pentanediol, 1,5-pentanediol, 2,2-dimethyl-1,3-propanediol trimethylpropane, 2-methyl-1,3-propanediol, diethylene glycol, propylene glycol, butanediol, ethylene glycol, glycerin, 2-pyrrolidone and the like.

The ink obtains the desired viscosity by adjusting the adding amount of the water-soluble organic solvent. The viscosity of ink may be measured by using a Sine-wave Vibro viscometer (SV-10 available from A&D Co. Ltd.).

(Inkjet Recording Head)

As one example of an inkjet recording head in the present invention, the state before attaching a piezoelectric actuator containing a laminated piezoelectric element 8 and an individual electrode 9 is shown in FIG. 1.

In the inkjet recording head, on a substrate 1, a plurality of dot formation parts each containing a pressure chamber 2 and a nozzle 3 communicating with the pressure chamber 2 are arranged.

Figure 2A:
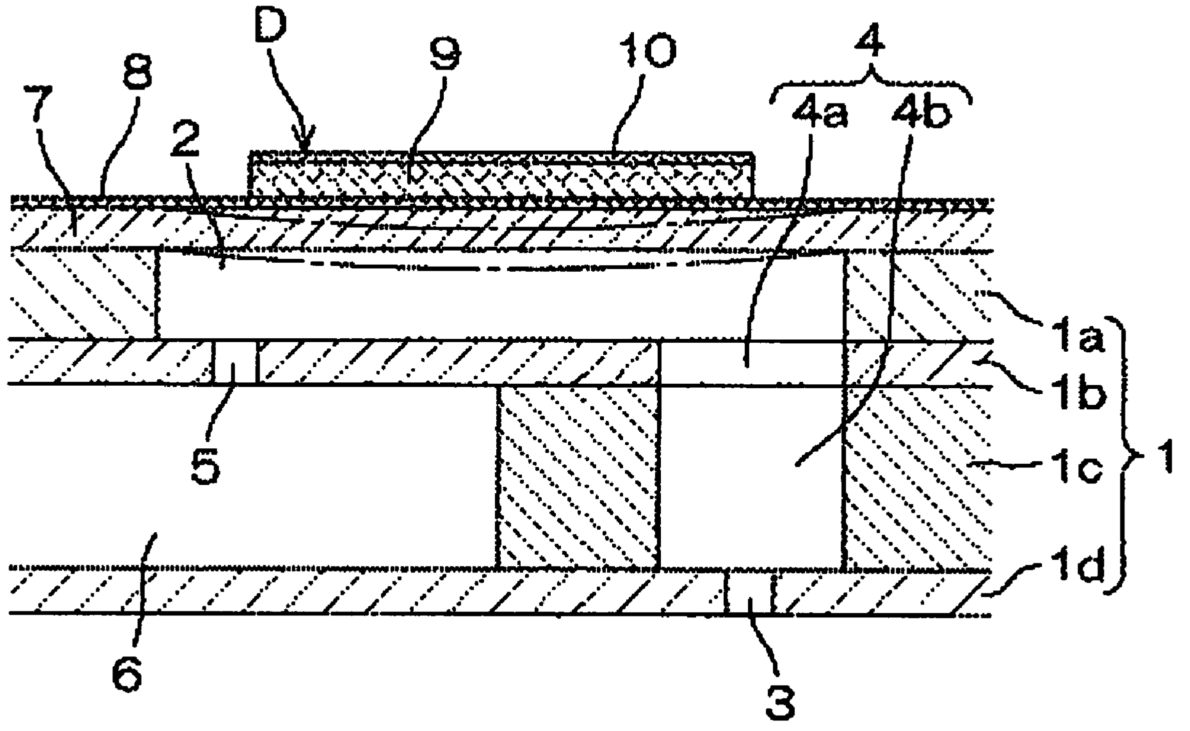
FIG. 2A is a partial enlarged lateral section view of the inkjet recording head according to the present invention.
Figure 2B:
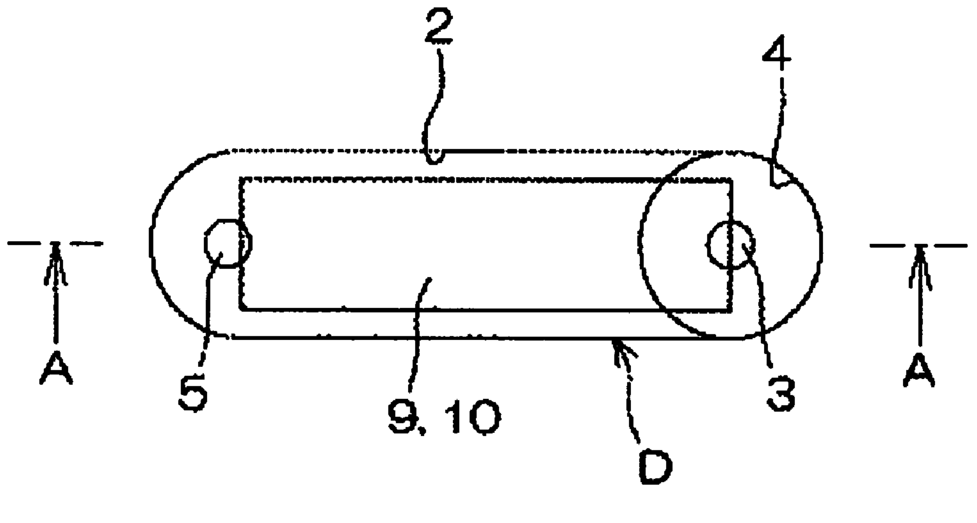
FIG. 2B is a bottom view of FIG. 2A.
Figure 3:
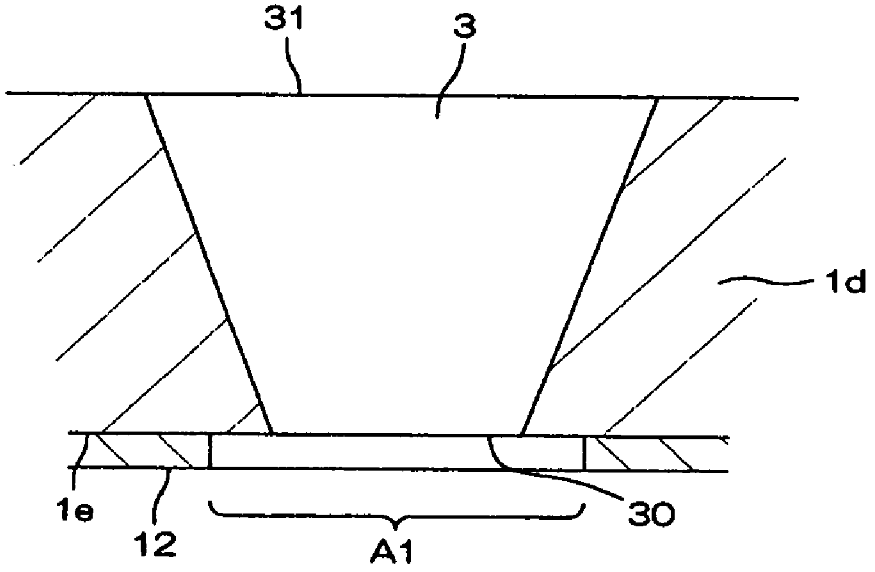
FIG. 3 is an enlarged view of a nozzle part in FIG. 2A.

FIG. 2A is an enlarged section view showing one dot formation part in the inkjet recording head in the state that a piezoelectric actuator is attached, and FIG. 2B is a perspective view showing the stacked state of each part constituting one dot formation part. FIG. 3 is an enlarged view of the nozzle 3 and its vicinity in FIG. 2A.

The nozzles 3 of dot formation part are arranged in plural lines in the main scanning direction (conveying direction of recording medium) shown by the arrow in FIG. 1. In FIG. 1, the arrangement includes four lines, and the pitch between dot formation parts in the same line is, for example, 150 dpi, so that 600 dpi is realized by the entire piezoelectric inkjet recording head.

As shown in FIG. 2A, each dot formation part is so configured that, one end side of the pressure chamber 2 formed on the top face of the substrate 1 and the nozzle 3 of a truncated cone shape are communicated through a nozzle flow channel 4. The other end of the pressure chamber 2 is connected to a common flow channel 6 (shown by broken lines in FIG. 1) through a supply port 5 formed into a circular column.

As shown in FIG. 1, the pressure chamber 2 has a planner shape in which its center is situated in the center part in the width direction of a rectangular part, and has end parts each having diameter equal to the length of width and a semicircular horizontal section shape, at both ends in the longitudinal direction of the rectangular part.

The nozzle 3 is concentric with a semicircle of the end part at either one end of the pressure chamber 2. The nozzle flow channel 4 is formed into a circular column having the same center and diameter with the semicircle of the end part.

The supply port 5 is formed into a circular column which is concentric with a semicircle of the end part of the pressure chamber 2. The common flow channel 6 is formed in the substrate 1 so that it communicates with each dot formation part.

Each part as described above is formed by laminating and integrating a first substrate 1*a* in which the pressure chamber 2 is formed, a second substrate 1*b* in which an upper part 4*a* of the ink flow channel 4 and the ink supply port 5 are formed, a third substrate 1*c* in which a lower part 4*b* of the ink flow channel 4 and the common flow channel 6 are formed, and a fourth substrate 1*d* in which the nozzle 3 is formed as a nozzle plate, in this order.

As shown in FIG. 3, in the nozzle 3, an opening 30 at the distal end of the ink droplet discharge side is formed into a circular shape on a bottom surface 1*e* of the fourth substrate 1*d* which is the bottom face side of the substrate 1. Also in the nozzle 3, the opening 30 on its distal end side is tapered (conical) so that it is smaller than an opening 31 on the side of the pressure chamber 2.

As shown in FIG. 1, the first substrate 1*a* and the second substrate 1*b* are formed with a through-hole 11*a* for constituting a joint part 11 for connecting the common flow channel 6 formed in the third substrate 1*c* to the piping 11*b* from an ink cartridge (not shown) on the top face side of the substrate 1. Further, each substrate 1*a* to 1*d* is made of, for example, resin or metal, and is formed into a plate member which is to become each part as described above, having a specific thickness and formed with a through-hole by etching utilizing photolithography.

On the top face side of the substrate 1, a piezoelectric actuator AC is formed by stacking the laminated piezoelectric element 8 having a planar shape and formed of thin plate operating in lateral vibration mode, which is substantially in the same size with the substrate 1 and has a common electrode 7 therein; and the individual electrode 9 having substantially rectangular same planar shape provided individually in the position overlapping a center part of the pressure chamber 2 in each dot formation part as shown by dashed-dotted lines in FIG. 1 in this order.

Both the common electrode 7 and the individual electrode 9 are formed from metal foil having excellent electric conductivity such as gold, silver, platinum, copper or aluminum, or from a plating film or vapor-deposited film of such metal.

As the piezoelectric material forming the piezoelectric element 8, for example, lead zirconate titanate (PZT), PZT to which one or two or more kinds of oxides such as lanthanum, barium, niobium, zinc, nickel, manganese is added, for example, PZT-based piezoelectric materials such as PLZT can be exemplified. Moreover, those based on lead magnesium niobate (PMN), lead nickel niobate (PNN), lead zinc niobate, lead manganese niobate, lead antimony stannate, lead titanate, barium titanate and the like can be exemplified.

The piezoelectric element 8 may be formed, for example, by adhesively securing a chip having a specific planner shape obtained by polishing a sintered body formed by sintering of the piezoelectric material into a thin plate, in a predetermined position, or by printing a specific planner shape with a paste prepared from metal oxide compound which are materials for piezoelectric material by a sol-gel method (or MOD method), followed by drying, pre burning and burning steps, or by forming a thin film of piezoelectric material into a planner shape by gas-phase growing methods such as reactive sputtering, reactive vacuum deposition, or reactive ion plating.

Centerline average roughness of piezoelectric element 8 can have desired centerline average roughness by particle growth promotion in burning condition or by being subjected to surface treatment using mechanical polishing or etching. The surface roughness of the piezoelectric element 8 may be measured using, for example, an optical interferotype centerline average roughness meter (Wyko NT1100 available from Veeco), and arithmetic average roughness Ra(μm) can be used as evaluating means.

In order to drive the piezoelectric element 8, for example, in a lateral vibration mode, polarization of the piezoelectric material is made to be oriented in the direction of thickness of the piezoelectric element 8, more specifically, in the direction directing from the individual electrode 9 to the common electrode 7. To achieve this, conventionally known polarizing method such as a high-temperature polarizing method, room temperature polarizing method, alternating electric field superimposing method, and electric field cooling method may be used. Further, the piezoelectric element 8 after polarization may be subjected to aging process.

The piezoelectric element 8 in which a polarizing direction of the piezoelectric material is oriented to the above direction will shrink in the plane crossing at right angles with the polarization direction upon application of a positive driving voltage from the individual electrode 9 while the common electrode 7 is grounded. Therefore, the force when deflection occurs is transferred to the ink in the pressure chamber 2 as a pressure wave, and this pressure wave causes oscillation of ink in the supply port 5, the pressure chamber 2, the nozzle flow channel 4, and the nozzle 3. Then the velocity of the oscillation eventually goes outside the nozzle 3, so that the ink meniscus in the nozzle 3 is pushed externally through the distal end opening 30 of the ink droplet discharge side, and an ink column is formed. Thereafter, velocity of oscillation goes inside the nozzle, while the ink column continues moving in the external direction of the nozzle, with the result that one or two droplets of ink separated from the ink meniscus flies in the direction of sheet face, and forms a dot on the sheet.

The amount of ink consumed by flying of ink droplets is recharged into the nozzle 3 by surface tension of the ink meniscus in the nozzle 3, from the ink cartridge, via the piping of the ink cartridge, the joint part 11, the common flow channel 6, the supply port 5, the pressure chamber 2, and the ink flow channel 4.

On a bottom surface 1*e* of the fourth substrate 1*d* which is the bottom face side of the substrate 1, a planar area A1 which is not subjected to water-repellent finish, and the circular opening 30 of the distal end of the nozzle 3 are provided in overlapping manner. That is, a water repellent layer 12 is overlaid on the surface 1*e* excluding the area A1 to provide water-repellent finish, while in the area A1, water-repellent finish is not made and the surface of the fourth substrate 1*d* is exposed so as to achieve the condition in which no water repellent layer 12 is formed.

Film thickness of the water repellent layer 12 is preferably, but is not particularly limited to, 0.5 to 2 μm. When the film thickness of the water repellent layer 12 is less than this range, water repellency decreases, and defect in discharge of ink droplet may occur due to adhesion of ink. The water repellent layer 12 having a film thickness of larger than 2 μm is difficult to be formed, and even if such a layer is provided, no more effect may be obtained.

As a driving method of the piezoelectric inkjet head used in the present invention, any of a pull-push system in which the piezoelectric element 8 is caused to deform in the direction the volume of the pressure chamber 2 decreases immediately before dot formation to draw-in the ink meniscus in the nozzle and then the piezoelectric element 8 is caused to deform in the direction the volume of pressure chamber 2 decreases to separate ink droplet from the ink meniscus and discharge the same; and a push-push system in which the piezoelectric element 8 is caused to deform in the direction the volume of pressure chamber 2 decreases to push out the ink meniscus in the nozzle 3, and then the piezoelectric element 8 is caused to deform in the direction the volume of pressure chamber 2 increases to draw in the ink meniscus, thereby making an ink droplet separate from the ink meniscus and discharging the same, thereby making an ink droplet separate from the ink meniscus and discharging the same in time of dot formation.

For achieving high-speed printing, in the recording apparatus of the present invention, the recording head has 500 or more nozzles, preferably 1000 to 3000 nozzles, and is driven at frequency of 15 kHz or higher, and the recording head may be used while two or more, preferably two to eight, more preferably two to four recording heads are connected in the horizontal direction which is perpendicular to the convey direction of the recording medium. By connecting plural recording heads so that they span the width of the recording medium or longer, they can be used as a line head.

In initial charging of ink into the inkjet recording head, as shown in FIG. 1, ink is supplied to the recording head via the joint part 11 while a pump (not illustrated) is placed between piping from the ink cartridge (not illustrated) and the joint part 11 for connecting the piping. As the pump, a tube pump, a gear pump, an electromagnetic pump and the like may be used according to the purpose.

In the case of color printing, ink forms a multicolor set in combination with the recording head, and usually forms an ink set including yellow, magenta, cyan and black. And it is preferred to form a recording apparatus combining the ink and recording head of the present invention using such a set.

Second Embodiment

Another embodiment of the inkjet recording system according to the present invention will now be described based on FIGS. 1 to 4, focus on the difference from the first embodiment to avoid redundant description with the first embodiment.

According to the present invention, the viscosity of ink is 2 to 10 mPa·s, and preferably 3 to 9 mPa·s. If the viscosity of ink exceeds 10 m Pa·s, the supply of ink to the pressure chamber 2 becomes insufficient, and continuous discharge cannot be carried out. If the viscosity of ink is less than 2 mPa·s, microscopic vibration remains in the channel from the pressure chamber 2 to the nozzle 3 thereby adversely affecting the continuous discharge.

Since the supply port for charging ink to the pressure chamber 2 is a very narrow capillary tube of 20 to 60 μm, air lock occurs in time of initial charging at the relevant portion if the surface tension of ink is higher than 45 mN/m, and ink may not be charged.

If the ink is supplied at a pressure of greater than or equal to 50 kPa in the initial charging, surface roughness of the piezoelectric element 8 must be considered to charge the ink without forming bubbles in the ink channel.

According to the present invention, average inclination Δa of the piezoelectric element 8 is 100 to 1000 mrad, and preferably 300 to 950 mrad. When the average inclination exceeds 1000 mrad, cracks easily occur, the applicable drive voltage lowers, and ink discharging speed of 10 m/2 cannot be obtained.

Figure 4:
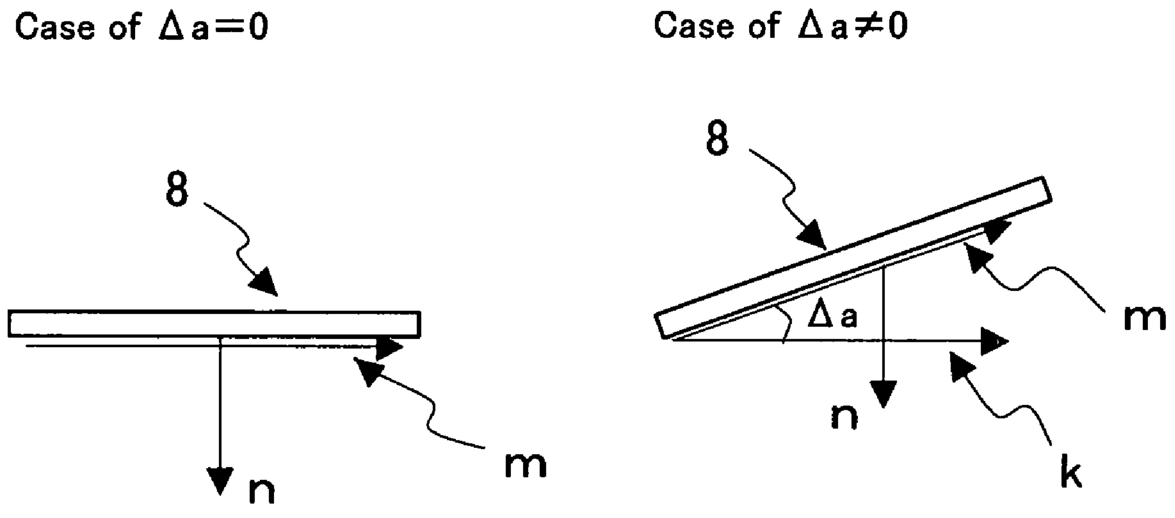
FIG. 4 is a schematic view showing the relationship between average surface inclination Δa and each directional component of wetting speed of ink in the present invention.

Expression (2) expressing the relationship between the average inclination of the piezoelectric element and the physical value of the ink in the present invention takes cos θ, which is index of wetness, and viscosity of ink, which leads to lowering in speed into consideration, and by multiplying this by cos (Δa), velocity component k in the average surface parallel direction of the piezoelectric element 8 is taken out as shown in FIG. 4. In FIG. 4, m represents the wetting velocity component, and n represents a normal direction with respect to the average surface of piezoelectric element. Therefore, by satisfying expression (2), the ink is rapidly charged, initial chargeability is satisfied, and continuous discharging property and discharge failure are improved. As a result, effect excelling in image variation is obtained.

Average inclination of piezoelectric element 8 is adjustable by particle growth promotion in burning condition or by being subjected to surface treatment using mechanical polishing or etching, and can have the desired average inclination. Average inclination of the piezoelectric element 8 may be measured using, for example, an optical interferotype surface roughness meter (Wyko NT1100 available from Veeco).

The other configuration is as same as that of the previous embodiment, and hence detailed description thereof will be omitted.

For achieving high-speed printing, in the recording apparatus of the present invention, the recording head has 500 or more nozzles, width is 1 centimeter or larger, and two or more, preferably two to eight, more preferably two to four recording heads are connected in the horizontal direction which is perpendicular to the convey direction of the recording medium. Preferably, it is used as a line head by connecting plural inkjet recording heads so that they span the width of the recording medium or longer. Convey speed of the recording medium is preferably 60 to 100 mm/s.

Examples and Comparative Examples of the present invention will now be described. It is understood, however, that the examples are for the purpose of illustration and the invention is not to be regarded as limited to any of the specific materials or condition therein.

EXAMPLES

Examples 1 to 8 and Comparative Examples 1 to 4

(Preparation of Ink)

A pigment dispersion was prepared as described below using C.I. pigment red 122 as a coloring agent to be contained in the ink, and using water-soluble resin.

(Pigment Dispersion)

| | |
|---|---|
| C.I. pigment red 122 | 30% by mass |
| Johncryl 61 | 15% by mass |

(Acryl-Styrene Resin Available from Johnson Polymer Co. Ltd.)

| | |
|---|---|
| Glycerin | 10% by mass |
| Ion-exchanged water | 45% by mass |

The pigment dispersion was mixed in the above composition, and was dispersed until the average particle diameter became 100 nm with the ball mill using zirconia beads of 0.5 mm. The pigment dispersion was diluted to five times with the ion-exchanged water and the average particle diameter was checked with dynamic light scattering particle size meter (LB-550 available from HORIBA, Ltd.).

Using the magenta pigment dispersion, each component was mixed in the composition shown in table 1 and stirred for ten minutes, and thereafter used a filter having a hole diameter of 5 μm to obtain inks No. 1 to 7. The surfactant used was Olfin E1010 [available from Nisshin Chemical Industry, EO (Ethylene-Oxide) adduct of acetylenediol].

TABLE 1

| | Ink No. Composition (% by mass) | | | | | | |
|---|---|---|---|---|---|---|---|
| Material/Properties | 1 | 2 | 3 | 4 | 5 | 6 | 7 |
| Olfin E1010 | 0.5 | 0.5 | 0.5 | 0.5 | 0.5 | 0.5 | 0.25 |
| Hexylen glycol | 0 | 5 | 5 | 5 | 5 | 5 | 5 |
| 2-Pyrrolidone | 5 | 5 | 5 | 5 | 5 | 5 | 5 |
| Glycerine | 5 | 5 | 10 | 30 | 45 | 50 | 45 |
| Pigment dispersion | | | | 20 | | | |
| Water | residue | residue | residue | residue | residue | residue | residue |
| Surface tension (mN/m) | 36.0 | 33.5 | 34.0 | 35.0 | 35.5 | 36.0 | 42.0 |
| Viscosity (mPa · s) | 1.5 | 2.0 | 3.0 | 5.0 | 10.0 | 11.5 | 10.0 |

(Fabrication of Inkjet Recording Head)

An inkjet recording head in which 166 dot formation parts per one line, and the total (four lines) of 664 dot formation parts are arranged on the substrate 1 was used. Each of these dot formation parts has the structure shown in FIG. 1 and FIGS. 2A, 2B and consists of the pressure chamber 2 having area of 0.2 $mm^2$ and measuring 2200 μm in width and 100 μm in depth, the nozzle flow channel 4 measuring 200 μm in diameter and 800 μm in length, the supply port 5 measuring 30 μm in diameter and 40 μm in length, the nozzle 3 measuring 30 μm in length, and the opening 30 on the ink discharge side and the opening 31 on the side of pressure chamber 2 in the shapes of circles of 10 μm and 20 μm in diameter, respectively.

The pitch between adjacent dot formation parts in the same line was 150 dpi, and the total of 600 dpi was established by shifting the neighboring lines by ½ pitch.

(Evaluation Method)

Using the ink and the inkjet recording head obtained in the above, as well as a recording apparatus mounting the ink and the inkjet recording head, ink droplets were discharged continuously, and discharge condition was observed. The evaluation was performed in the following manner. In brief, either one of the inks No. 1 to No. 7 shown in Table 1 was initially charged from an ink tank into an inkjet recording head incorporating a piezoelectric element having either one average surface roughness Ra of 0.056 μm and 0.138 μm under pressure of 150 kPa using a gear pump. Thereafter, the ink tank liquid level was positioned 10 cm below the nozzle surface, ink meniscus was formed in the nozzle, all the nozzles were simultaneously discharged, and the ink of 5,000 shots was continuously discharged at a driving voltage of 20V and at a driving frequency of 15 kHz and 20 kHz under an environment of 25° C. and 50% RH, and glazed paper was conveyed in parallel to the plane orthogonal to the ink discharging direction from the recording head to print images.

The printed result was evaluated with the following criteria.

o: nozzles with discharge failure not produced, continuous discharge until the end Δ: nozzles with discharge failure not produced, few nozzles did not continuously discharge until the end

*: nozzles with discharge failure produced, great number of nozzles did not continuously discharge until the end (Measurement of Surface Tension and Contact Angle)

The surface tension of ink was measured using automatic surface tension meter (BP-D4 available from Kyowa Interface Science Co., LTD.), and the contact angle of ink was measured using a contact angle meter available from Kyowa Interface Science Co., LTD. The contact angle of the ink with respect to the piezoelectric element was measured to be 45 degrees excluding ink No. 7. The contact angle of ink No. 7 was 57 degrees.

(Measurement of Average Surface Roughness)

Centerline average roughness Ra of surface of piezoelectric element was measured using an optical interferotype centerline average roughness meter (Wyko NT1100 available from Veeco), and centerline average roughness Ra (μm) was obtained.

(Evaluation Result)

As shown in Table 2, when the viscosity of ink, the surface roughness of the piezoelectric element, and the value of expression (1) fall within the ranges of the present invention, satisfactory result was obtained in continuous discharging property.

When viscosity of ink is outside the range of the present invention, the continuous discharging property is not satisfactory, and nozzles with discharge failure produced (comparative examples 1, 2, 4). Furthermore, when viscosity of ink and surface roughness of the piezoelectric element fall within the ranges of the present invention and the value of expression (1) is outside the range of the present invention, unsatisfactory result was obtained for the continuous discharging property (comparative example 3).

Examples 9 to 16 and Comparative Examples 5 to 8

The discharge condition of ink was observed, similarly to examples 1 to 8 and comparative examples 1 to 4, except that ink No. 1 to 6 prepared in examples 1 to 8 and comparative examples 1 to 4 was used and the ink was initially charged from an ink tank into an inkjet recording head incorporating

TABLE 2

| | Ink No. | Viscosity (mPa · s) | Surface tension (mN/m) | Surface roughness of piezoelectric element (μm) | Value of expression (1) | Evaluation result |
|---|---|---|---|---|---|---|
| Example 1 | 2 | 2 | 33.5 | 0.056 | 0.33 | Δ |
| Example 2 | 3 | 3 | 34.0 | 0.056 | 0.22 | ○ |
| Example 3 | 4 | 5 | 35.0 | 0.056 | 0.14 | ○ |
| Example 4 | 5 | 10 | 35.5 | 0.056 | 0.07 | Δ |
| Example 5 | 2 | 2 | 33.5 | 0.138 | 0.82 | ○ |
| Example 6 | 3 | 3 | 34.0 | 0.138 | 0.55 | ○ |
| Example 7 | 4 | 5 | 35.0 | 0.138 | 0.34 | ○ |
| Example 8 | 5 | 10 | 35.5 | 0.138 | 0.17 | ○ |
| Comp. Ex. 1 | 1 | 1.5 | 36.0 | 0.056 | 0.48 | X |
| Comp. Ex. 2 | 6 | 11.5 | 36.0 | 0.138 | 0.15 | X |
| Comp. Ex. 3 | 7 | 10 | 42.0 | 0.056 | 0.06 | X |
| Comp. Ex. 4 | 6 | 11.5 | 36.0 | 0.056 | 0.06 | X |

The viscosity, surface tension, and contact angle of the ink, as well as the average surface roughness of the piezoelectric element were measured in the following manner.

(Measurement of Viscosity)

The viscosity of the ink was measured using a Sine-wave Vibro viscometer (SV-10 available from A&D Co. Ltd.).

a piezoelectric element having either one average inclination Δa of 383 mrad and 922 mrad under pressure of 150 kPa using a gear pump.

The printed result was evaluated with the following criteria.

o: nozzles with discharge failure not produced, continuous discharge from first discharge Δ: nozzles with discharge failure not produced, continuous discharge from second discharge

*: nozzles with discharge failure produced, continuous discharge from second discharge

TABLE 3

| | Ink No. | Viscosity (mPa · s) | Average inclination (mrad) | Value of expression (2) | Evalution result |
|---|---|---|---|---|---|
| Example 9 | 2 | 2 | 383 | 0.328 | Δ |
| Example 10 | 3 | 3 | 383 | 0.219 | ○ |
| Example 11 | 4 | 5 | 383 | 0.109 | ○ |
| Example 12 | 5 | 10 | 383 | 0.066 | Δ |
| Example 13 | 2 | 2 | 922 | 0.214 | Δ |
| Example 14 | 3 | 3 | 922 | 0.142 | ○ |
| Example 15 | 4 | 5 | 922 | 0.071 | ○ |
| Example 16 | 5 | 10 | 922 | 0.043 | Δ |
| Comp. Ex. 5 | 1 | 1.5 | 383 | 0.437 | X |
| Comp. Ex. 6 | 6 | 11.5 | 383 | 0.057 | X |
| Comp. Ex. 7 | 1 | 1.5 | 922 | 0.285 | X |
| Comp. Ex. 8 | 6 | 11.5 | 922 | 0.037 | X |

The viscosity of ink was measured at the same manner as in examples 1 to 8 and comparative examples 1 to 4. The average inclination of the piezoelectric element was measured in the following manner.

(Measurement of Average Inclination)

The average inclination Δa of the surface of the piezoelectric element was measured using an optical interferotype centerline average roughness meter (Wyko NT1100 available from Veeco), and average inclination (mrad) was obtained. The contact angle of ink with respect to the piezoelectric element measured similarly to the above was 45 degrees.

(Evaluation Result)

As shown in table 3, when the viscosity of the ink, the average inclination of the piezoelectric element, and the value of expression (2) fall within the ranges of the present invention, satisfactory result was obtained for the continuous discharging property. When the viscosity of the ink is outside the range of the present invention, the continuous discharging property is not satisfactory, and nozzles with discharge failure produced (comparative examples 5 to 8).

What is claimed is:

1. An inkjet recording system comprising an inkjet recording head in which a part of wall face of a pressure chamber in which a nozzle is provided is formed of a piezoelectric element, and said piezoelectric element is activated and deformed to make pressure wave act on ink in said pressure chamber, thereby discharging an ink droplet from said nozzle, wherein centerline average roughness Ra of said piezoelectric element ranges from 0.05 to 2 μm, viscosity of said ink ranges from 2.0 to 10.0 mPa·s, and the following expression (1) is satisfied;

$$\sqrt{\frac{r\gamma\cos\theta}{2\eta}} \geq 0.07 \qquad (1)$$

wherein r represents centerline average roughness (μm) of surface of piezoelectric element forming wall face of the pressure chamber, γ represents surface tension (mN/m) of ink, η represents viscosity of ink (mPa·s), and θ represents contact angle (degree) of ink with respect to piezoelectric element.

2. The inkjet recording system according to claim 1, wherein said inkjet recording head is formed of a plurality of dot formation parts, each dot formation part having said pressure chamber and said nozzle communicating thereto, said pressure chamber being formed of a substrate and a piezoelectric element having a common electrode formed therein, and an individual electrode is disposed in a position facing to said pressure chamber of said piezoelectric element for applying a driving voltage to said piezoelectric element.

3. The inkjet recording system according to claim 1, wherein said ink comprises at least water, a coloring agent, a water-soluble organic solvent and a surfactant.

4. The inkjet recording system according to claim 3, wherein said coloring agent comprises a pigment.

5. An inkjet recording system comprising an inkjet recording head in which a part of wall face of a pressure chamber in which a nozzle is provided is formed of a piezoelectric element, and said piezoelectric element is activated and deformed to make pressure wave act on ink in said pressure chamber, thereby discharging an ink droplet from said nozzle, wherein an average inclination Δa ranges from 100 to 1000 mrad, viscosity of said ink ranges from 2.0 to 10.0 mPa·s, and the following expression (2) is satisfied;

$$\frac{\cos\theta}{\eta} \times \cos(\Delta a) \geq 0.040 \qquad (2)$$

wherein Δa represents average inclination (rad) of surface of piezoelectric element forming wall face of pressure chamber, θ represents contact angle (degree) of ink with respect to piezoelectric element, and η represents viscosity of ink (mPa·s).

6. The inkjet recording system according to claim 5, wherein said inkjet recording head is formed of a plurality of dot formation parts, each dot formation part having said pressure chamber and said nozzle communicating thereto, said pressure chamber being formed of a substrate, and a piezoelectric element having a common electrode formed therein, and an individual electrode is disposed in a position facing to said pressure chamber of said piezoelectric element for applying a driving voltage to said piezoelectric element.

7. The inkjet recording system according to claim 5, wherein said ink comprises at least water, a coloring agent, a water-soluble organic solvent and a surfactant.

8. The inkjet recording system according to claim 7, wherein said coloring agent comprises a pigment.

9. An inkjet recording head comprising a pressure chamber in which a part of wall face is formed of a piezoelectric element and a nozzle communicating to said pressure chamber for discharging ink droplet, an individual electrode being disposed on a face opposite side to said pressure chamber side of said piezoelectric element for applying a driving voltage to said piezoelectric element, wherein surface of the piezoelectric element forming said part of wall face of the pressure chamber has a centerline average roughness Ra ranging from 0.05 to 2 μm, viscosity of said ink ranging from 2.0 to 10.0 mPa·s, and the following expression (1) being satisfied;

$$\sqrt{\frac{r\gamma\cos\theta}{2\eta}} \geq 0.07 \qquad (1)$$

wherein r represents centerline average roughness (μm) of surface of piezoelectric element forming wall face of the pressure chamber, γ represents surface tension (mN/m) of ink, η represents viscosity of ink (mPa·s), and θ represents contact angle (degree) of ink with respect to piezoelectric element.

10. An inkjet recording head comprising a pressure chamber in which a part of wall face is formed of a piezoelectric element and a nozzle communicating to said pressure chamber for discharging ink droplet, an individual electrode being disposed on a face opposite side to said pressure chamber side of said piezoelectric element for applying a driving voltage to said piezoelectric element, wherein surface of the piezoelectric element forming said part of wall face of the pressure chamber has an average inclination ha ranging from 100 to 1000 mrad, viscosity of said ink ranging from 2.0 to 10.0 mPa·s, and the following expression (2) being satisfied;

$$\frac{\cos\theta}{\eta} \times \cos(\Delta a) \geq 0.040 \quad (2)$$

wherein Δa represents average inclination (rad) of surface of piezoelectric element forming wall face of pressure chamber, θ represents contact angle (degree) of ink with respect to piezoelectric element, and η represents viscosity of ink (mPa·s).

11. A recording apparatus provided with the inkjet recording head according to claim 9.

12. The recording apparatus according to claim 11, wherein said inkjet recording head has 500 or more nozzles, and two or more said recording heads are arranged in the horizontal direction which is perpendicular to a conveying direction of recording medium.

13. A recording apparatus provided with the inkjet recording head according to claim 10.

14. The recording apparatus according to claim 13, wherein said inkjet recording head has 500 or more nozzles, and two or more said recording heads are arranged in the horizontal direction which is perpendicular to a conveying direction of recording medium.

* * * * *